United States Patent
Miyao et al.

(10) Patent No.: US 10,760,180 B2
(45) Date of Patent: Sep. 1, 2020

(54) POLYCRYSTALLINE SILICON INGOT, POLYCRYSTALLINE SILICON BAR, AND METHOD FOR PRODUCING SINGLE CRYSTAL SILICON

(71) Applicant: Shin-Etsu Chemical Co., Ltd., Tokyo (JP)

(72) Inventors: Shuichi Miyao, Niigata (JP);
Shigeyoshi Netsu, Niigata (JP);
Naruhiro Hoshino, Niigata (JP);
Tetsuro Okada, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 15/785,895

(22) Filed: Oct. 17, 2017

(65) Prior Publication Data
US 2018/0105950 A1     Apr. 19, 2018

(30) Foreign Application Priority Data

Oct. 18, 2016   (JP) ................. 2016-204077

(51) Int. Cl.
 *C30B 29/06* (2006.01)
 *C30B 13/34* (2006.01)
 *C01B 33/035* (2006.01)

(52) U.S. Cl.
 CPC ............ *C30B 13/34* (2013.01); *C01B 33/035* (2013.01); *C30B 29/06* (2013.01)

(58) Field of Classification Search
 CPC .......... B22D 25/02; C30B 29/06; C30B 28/12
 See application file for complete search history.

(56) References Cited

U.S. PATENT DOCUMENTS

| | | | | |
|---|---|---|---|---|
| 4,123,989 | A * | 11/1978 | Jewett | C01B 33/02 118/724 |
| 4,734,297 | A | 3/1988 | Jacubert et al. | |
| 2008/0286550 | A1 | 11/2008 | Sofin et al. | |
| 2012/0251426 | A1* | 10/2012 | Sato | B22D 25/02 423/348 |
| 2014/0030440 | A1* | 1/2014 | Netsu | C01B 33/035 427/457 |
| 2015/0107508 | A1 | 4/2015 | Ishida et al. | |
| 2017/0225957 | A1 | 8/2017 | Netsu et al. | |

FOREIGN PATENT DOCUMENTS

| | | |
|---|---|---|
| JP | 61-127617 A | 6/1986 |
| JP | 3-215310 A | 9/1991 |
| JP | 2008-285403 A | 11/2008 |
| JP | 2012-232878 A | 11/2012 |
| JP | 2012-232879 A | 11/2012 |
| JP | 2013-193902 A | 9/2013 |
| JP | 2016-052970 A | 4/2016 |

OTHER PUBLICATIONS

Office Action dated Aug. 13, 2019, issued in counterpart JP Application No. 2016-204077, with English translation (8 pages).

\* cited by examiner

*Primary Examiner* — Robert M Kunemund
(74) *Attorney, Agent, or Firm* — Westerman, Hattori, Daniels & Adrian, LLP

(57) ABSTRACT

A polycrystalline silicon ingot having a value of $T_e-T_s$, $\Delta T$, of 50° C. or less, wherein $T_s$ and $T_e$ are the onset temperature and the completion temperature of melting, respectively, when the temperature is increased at a rate of 60° C./minute or less in the temperature range of 1400° C. or more is used as the production raw material for single crystal silicon. The present invention provides a polycrystalline silicon ingot or polycrystalline silicon rod suitable for stably producing single crystal silicon.

6 Claims, No Drawings

POLYCRYSTALLINE SILICON INGOT, POLYCRYSTALLINE SILICON BAR, AND METHOD FOR PRODUCING SINGLE CRYSTAL SILICON

BACKGROUND OF THE INVENTION

Field of the Invention

The present invention relates to polycrystalline silicon ingots and polycrystalline silicon rods suitable for stably producing single crystal silicon.

Description of the Related Art

Single crystal silicon essential for production of devices such as semiconductor devices is grown by the CZ method or the FZ method, and a polycrystalline silicon ingot or a polycrystalline silicon rod is used as the raw material in such a case. Such a polycrystalline silicon material is produced, in many cases, by the Siemens method. The Siemens method is a method in which a gas of a silane raw material such as trichlorosilane or memosilane is brought into contact with a heated silicon core wire to thereby allow polycrystalline silicon to grow in the vapor phase (deposit) on the surface of the silicon core wire by the Chemical Vapor Deposition (CVD) method.

For example, when single crystal silicon is grown by the CZ method, a polycrystalline silicon ingot is placed in a quartz crucible and heated to be melted, a seed crystal is dipped in the resulting silicon melt to extinguish dislocation lines to achieve freedom from dislocation, the crystal diameter is being slowly increased until the diameter of the crystal reaches a predetermined diameter, and then the crystal is pulled up. In this case, when unmelted polycrystalline silicon remains in the silicon melt, the unmelted polycrystalline pieces drift in the vicinity of the solid-liquid interface by convection to induce the generation of dislocation, and thus the polycrystalline silicon remaining unmelted causes the crystal line to disappear.

Japanese Patent Laid-Open No. 2008-285403 reports the following: inhomogeneous crystals, which are needle crystals, may be deposited during a process of producing a polycrystalline silicon rod by the Siemens method; if single crystal silicon is grown by the FZ method using the polycrystalline silicon rod in which the needle crystals have been deposited, individual crystallites are not melted homogeneously according to their sizes because of the aforementioned inhomogeneous crystals; and then, the unmelted crystallites as solid particles pass through the melting zone toward the single-crystal rod and are incorporated as unmelted particles into the solidified surface of the single-crystal, thereby causing disappearance of crystal lines.

When crystal lines disappear, single crystal silicon cannot be obtained anymore. In order to increase the production yield, techniques are desired to clear up the cause of disappearance of crystal lines and to provide polycrystalline silicon ingots and polycrystalline silicon rods for stable production of single crystal silicon.

SUMMARY OF THE INVENTION

Technical Problem

The present invention has been made in view of such problems and aims to provide a polycrystalline silicon ingot and a polycrystalline silicon rod suitable for stably producing single crystal silicon.

Solution to Problem

In order to solve the above-described problems, a polycrystalline silicon ingot according to the present invention is characteristic of having a value of $T_e-T_s$, $\Delta T$, of 50° C. or less, wherein $T_s$ and $T_e$ are the onset temperature and the completion temperature of melting, respectively, when the temperature is increased at a rate of 60° C./minute or less in the temperature range of 1400° C. or more.

For example, the polycrystalline silicon ingot is a polycrystalline silicon ingot extracted from a polycrystalline silicon rod synthesized by the Siemens method.

The polycrystalline silicon rod according to the present invention is a polycrystalline silicon rod synthesized by the Siemens method and characterized in that a polycrystalline silicon ingot extracted from any portion of the polycrystalline silicon rod has a value of $T_e-T_s$, $\Delta T$, of 50° C. or less, wherein $T_s$ and $T_e$ are the onset temperature and the completion temperature of melting, respectively, when the temperature is increased at a rate of 60° C./minute or less in the temperature range of 1400° C. or more.

In the method for producing a single crystal silicon according to the present invention, the polycrystalline silicon ingot or polycrystalline silicon rod aforementioned is used as the raw material for production of single crystal silicon by the CZ method and the FZ method.

Advantageous Effects of Invention

The polycrystalline silicon ingot according to the present invention, which exhibits the melting property described above, markedly prevents disappearance of crystal lines when a single crystal silicon is produced. In other words, according to the present invention, polycrystalline silicon ingots and polycrystalline silicon rods suitable for stably production of single crystal silicon are provided.

DETAILED DESCRIPTION OF THE PREFERRED EMBODIMENTS

While conducting studies on the cause of disappearance of crystal lines occurring on growing single crystal silicon, the present inventors have focused on the melting properties of polycrystalline silicon used as the raw material. As a result, the present inventor has found that the frequency (possibility) of disappearance of crystal lines is significantly reduced when polycrystalline silicon satisfying certain melting conditions is used as the raw material for growing single crystal silicon.

When single crystal silicon is grown by the CZ method, polycrystalline silicon is melted in a crucible, and then, a seed crystal silicon rod is immersed in the silicon melt and drawn up while rotated to obtain a single crystal ingot having the same atomic arrangement as that of the seed crystal. On the other hand, for growing single crystal silicon by the FZ method, in which no crucible is used, a seed crystal is placed under the polycrystalline silicon rod. The seed crystal and the polycrystalline silicon rod are melted at their boundary by induction heating, and this silicon melt is single-crystallized while held by surface tension.

It is assumed that disappearance of crystal lines is caused when unmelt fines drifting in the silicon melt reach the solid-liquid interface. Accordingly, elimination of such unmelt should prevent crystal lines from disappearing to thereby achieve crystal growth conditions for a high single crystal yield.

The present inventors thus have conducted heating and temperature-increasing tests on polycrystalline silicon raw material in which disappearance of crystal lines was caused and polycrystalline silicon raw material in which disappearance of crystal lines was not caused, to thereby observe melting phenomena in the temperature increasing process and compare the melting properties. Specifically, cylindrical cores having a diameter of 19 mm were gouged from each portion of a polycrystalline silicon rod grown by the Siemens method. From these cores, planar samples having a thickness of 2 mm were cut out, and the surface of the samples were mirror-finished by buffing.

Such a planar sample was placed in an alumina container and heated using a halogen lamp at a rate of temperature increase of 50° C./minute at room temperature (25° C.) to 200° C., of 200° C./minute at 200° C. to 1200° C., and of 50° C./minute at 1200° C. to 1500° C. When the temperature was reached to 1500° C., the sample is maintained at the temperature for three minutes. Here, when the rate of temperature increase in a temperature range of 1200° C. to 1500° C., which includes the melting point of silicon, is 60° C./minute or less, observation is not hindered. However, a rate more than 70° C./minute is not preferred because the temperature at the moment of the beginning of melting ($T_s$) and the temperature at the moment where the entire mass is melted ($T_e$) become difficult to distinguish. The atmosphere in the measurement environment was a reducing atmosphere of argon containing 2% hydrogen gas.

The melting point of silicon, which is of the order of 1414° C., exceeds 1000° C. At such a high temperature, a large amount of infrared light is emitted not only from the sample itself but also from the surroundings of the sample. Thus, it is not possible to observe the state of the melting sample by the naked eye or with an optical microscope. Then, only a limited region at a small depth of focus (observation face was 4 mm×2 mm) was observed using a laser microscope, which allows an observation without effects of infrared light. As the laser microscope, a VL 2000 manufactured by Lasertec Corporation was used, and as the light source, a blue laser diode (wavelength 410 nm) was used.

An image having a resolution of 0.15 μm and a magnification of 560 was video-recorded. The temperature of the sample surface was measured with a thermocouple thermometer provided at the lower part of the alumina container aforementioned, and the temperature was recorded in synchronization with the sample image. While the image reproduced was observed, the temperature at the moment of the beginning of melting ($T_s$) and the temperature at the moment where the entire mass was melted ($T_e$) were measured.

Such experiments were repeated on various polycrystalline silicon. As a result, it was found that disappearance of crystal lines was of significantly rare occurrence on growing single crystal silicon in the case of using as the raw material a polycrystalline silicon ingot having a value of $T_e-T_s$, ΔT, of 50° C. or less, wherein $T_s$ and $T_e$ are the onset temperature and the completion temperature of melting, respectively, when the temper at lire is increased at a rate of 60° C./minute or less in a temperature range including the melting point of silicon, specifically in the temperature range of 1400° C. or more. It was also found that, as a general tendency, polycrystalline silicon ingots which caused no disappearance of crystal lines when single crystal silicon was grown has a relatively low $T_s$ temperature.

In other words, on growing single crystal silicon by the CZ method and growing single crystal silicon by the FZ method, it can be seen that use of a polycrystalline silicon ingot or a polycrystalline silicon rod satisfying the melting conditions described above as the raw material increases the production yield.

When a similar melting property test was conducted also on single crystal silicon, the value of $T_e-T_s$, ΔT, was as small as 1° C. both for single crystal silicon by the CZ method and single crystal silicon by the FZ method (see Table 1).

TABLE 1

| | Rate of temperature increase: 50° C./minute | |
|---|---|---|
| CZ single crystal Si | $T_s$ (° C.) | 1,478 |
| | $T_e$ (° C.) | 1,479 |
| | $\Delta T_e - T_s$ (° C.) | 1 |
| FZ single crystal Si | $T_s$ (° C.) | 1,478 |
| | $T_e$ (° C.) | 1,479 |
| | $\Delta T_e - T_s$ (° C.) | 1 |

The present inventors consider that a deposition rate of 5 μm/minute or more is preferred in order to synthesize polycrystalline silicon that satisfies the melting conditions aforementioned by the Siemens method. According to the experience of the present inventors, when polycrystalline silicon grown under conditions that produce polycrystalline silicon at a low deposition rate is melted, "unmelt" tends to remain in the melt.

According to the experiment of the present inventors, when the deposition rate is 5 μm/minute or more (preferably 7 to 12 μm/minute or more), the value of $T_e-T_s$, ΔT, described above becomes relatively small.

EXAMPLES

Two blocks extracted from a polycrystalline silicon rod grown under the same conditions as those for a polycrystalline silicon rod in which crystal lines did not disappear (A1 and A2) and two blocks extracted from a polycrystalline silicon rod grown under the same conditions as those for a polycrystalline silicon rod in which crystal lines disappeared (B1 and B2), when an FZ single crystal was drawn up, were provided. All the positions for extracting these blocks are in close proximity to the bridge of a silicone core wire assembled in a reversed D-shape.

Four planar samples were cut out from each of these blocks. While the rate of temperature increase was varied in the range of 50 to 80° C./minute, the value of $T_e-T_s$, ΔT, was determined under each condition. The results are shown in Table 2.

From these results, it can be seen that there exists a relation between the presence or absence of disappearance of crystal lines and the value of $T_e-T_s$, ΔT, and specifically that in the case where a polycrystalline silicon ingot having a value of $T_e-T_s$, ΔT, of 50° C. or less is used as the raw material, disappearance of crystal lines is of significantly rare occurrence on growing single crystal silicon.

The value of $T_e-T_s$, ΔT, described above is constant at a rate of temperature increase of 60° C./minute or less. In contrast, when the rate of temperature increase exceeds 60° C./minute, a smaller ΔT value is shown with a higher rate of temperature increase. This is because the temperature at the moment of the beginning of melting ($T_s$) and the temperature at the moment where the entire mass was melted ($T_e$) become difficult to distinguish when the rate of temperature increase is extremely high. Thus, the rate of temperature increase is preferably 60° C./minute or less.

TABLE 2

| Disappearance of crystal lines | | | Example 1 | Example 2 | Comparative Example 1 | Comparative Example 2 |
|---|---|---|---|---|---|---|
| | | | \multicolumn{4}{c}{Rate of temperature increase (° C./minute)} |
| | | | 50 | 60 | 70 | 80 |
| A1 | Not observed | $T_s$ (° C.) | 1,475 | 1,470 | 1,465 | 1,4760 |
| | | $T_e$ (° C.) | 1,500 | 1,495 | 1,485 | 1,475 |
| | | $\Delta T_e - T_s$ (° C.) | 25 | 25 | 20 | 15 |
| A2 | Not observed | $T_s$ (° C.) | 1,450 | 1,450 | 1,440 | 1,435 |
| | | $T_e$ (° C.) | 1,500 | 1,500 | 1,480 | 1,470 |
| | | $\Delta T_e - T_s$ (° C.) | 50 | 50 | 40 | 35 |
| B1 | Observed | $T_s$ (° C.) | 1,440 | 1,435 | 1,430 | 1,425 |
| | | $T_e$ (° C.) | 1,500 | 1,495 | 1,485 | 1,475 |
| | | $\Delta T_e - T_s$ (° C.) | 60 | 60 | 55 | 50 |
| B2 | Observed | $T_s$ (° C.) | 1,430 | 1,425 | 1,420 | 1,415 |
| | | $T_e$ (° C.) | 1,500 | 1,495 | 1,485 | 1,475 |
| | | $\Delta T_e - T_s$ (° C.) | 70 | 70 | 65 | 60 |

Subsequently, five polycrystalline silicon rods grown under different deposition conditions (C to G) were provided. These polycrystalline silicon rods, which were grown by the Siemens method, were deposited by varying the growth rate (deposition rate) in the range of 2 to 10 μm/minute with the concentration of trichlorosilane, which is the silicon raw material gas, held constant at 30 vol %.

Single crystal silicon was grown by the FZ method using each of these polycrystalline silicon rods as the raw material. The results obtained by checking the presence or absence of disappearance of crystal lines are summarized in Table 3. For those having a growth rate of 5 μm/minute or more, disappearance of crystal lines was not observed.

TABLE 3

| | Example 3 | Example 4 | Example 5 | Comparative Example 3 | Comparative Example 4 |
|---|---|---|---|---|---|
| Growth rate (μm/minute) | 10 | 7 | 5 | 4 | 2 |
| Trichlorosilane concentration (vol %) | 30 | 30 | 30 | 30 | 30 |
| Disappearance of crystal lines | Not observed | Not observed | Not observed | Observed | Observed |

INDUSTRIAL APPLICABILITY

The single crystal silicon ingot according to the present invention, which exhibits the melting property described above, markedly prevents disappearance of crystal lines when the single crystal silicon is produced. In other words, according to the present invention, polycrystalline silicon ingots and polycrystalline silicon rods suitable for stably production of single crystal silicon are provided.

What is claimed is:

1. A method for producing single crystal silicon, comprising:
    subjecting a polycrystalline silicon ingot as a raw material to a CZ process or a FZ process for producing single crystalline silicon,
    wherein the polycrystalline silicon ingot has a value of $T_e-T_s$, $\Delta T$, of 50° C. or less, wherein $T_s$ and $T_e$ are the onset temperature and the completion temperature of melting in the CZ process or the FZ process, respectively, when the temperature is increased at a rate of 60° C./minute or less in a temperature range of 1400° C. or more,
    wherein the polycrystalline silicon ingot is consistently grown under a condition that the deposition rate is 7 μm/minute or more.

2. The method for producing single crystal silicon according to claim 1, wherein the polycrystalline silicon ingot is a polycrystalline silicon ingot extracted from a polycrystalline silicon rod synthesized by the Siemens method.

3. A method for producing single crystal silicon, comprising:
    subjecting a polycrystalline silicon rod as a raw material to a CZ process or a FZ process for producing single crystalline silicon,
    wherein a polycrystalline silicon ingot extracted from any portion of the polycrystalline silicon rod has a value of $T_e-T_s$, $\Delta T$, of 50° C. or less, wherein $T_s$ and $T_e$ are the onset temperature and the completion temperature of melting in a CZ process or a FZ process for producing single crystalline silicon, respectively, when the temperature is increased at a rate of 60° C./minute or less in a temperature range of 1400° C. or more,
    wherein the polycrystalline silicon ingot is consistently grown under a condition that the deposition rate is 7 μm/minute or more.

4. A method of selecting polycrystalline silicon ingot for producing single crystal silicon, comprising:
    selecting a polycrystalline silicon ingot having a value of $T_e-T_s$, $\Delta T$, of 50° C. or less, wherein $T_s$ and $T_e$ are the onset temperature and the completion temperature of melting in the CZ process or the FZ process, respectively, when the temperature is increased at a rate of 60° C./minute or less in a temperature range of 1400° C. or more, and
    subjecting the polycrystalline silicon ingot as a raw material to a CZ process or a FZ process for producing single crystalline silicon, wherein the polycrystalline silicon ingot is consistently grown under a condition that the deposition rate is 7 μm/minute or more.

5. The method of selecting a polycrystalline silicon ingot for producing single crystal silicon according to claim 4, wherein the polycrystalline silicon ingot is a polycrystalline silicon ingot extracted from a polycrystalline silicon rod synthesized by the Siemens method.

6. A method of selecting polycrystalline silicon rod for producing single crystal silicon, comprising:
   selecting a polycrystalline rod such that a polycrystalline silicon ingot extracted from any portion of the polycrystalline silicon rod has a value of $T_e-T_s$, $\Delta T$, of 50° C. or less, wherein $T_s$ and $T_e$ are the onset temperature and the completion temperature of melting in a CZ process or a FZ process for producing single crystalline silicon, respectively, when the temperature is increased at a rate of 60° C./minute or less in a temperature range of 1400° C. or more, and
   subjecting the polycrystalline silicon rod as a raw material to a CZ process or a FZ process for producing single crystalline silicon,
   wherein the polycrystalline silicon ingot is consistently grown under a condition that the deposition rate is 7 μm/minute or more.

* * * * *